United States Patent
Lin et al.

(10) Patent No.: US 6,379,849 B1
(45) Date of Patent: Apr. 30, 2002

(54) METHOD FOR FORMING BINARY INTENSITY MASKS

(75) Inventors: Shy-Jay Lin, Yunghe; Wen-Chuan Wang, Tainan, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 47 days.

(21) Appl. No.: 09/696,081

(22) Filed: Oct. 26, 2000

(51) Int. Cl.[7] .............................. G03F 9/00; G03F 5/00
(52) U.S. Cl. ............................................ 430/5; 430/296
(58) Field of Search ........................... 430/5, 296, 322, 430/323, 324, 394; 216/57, 58, 83

(56) References Cited

U.S. PATENT DOCUMENTS

| | | | |
|---|---|---|---|
| 5,288,569 A | 2/1994 | Liu | 430/5 |
| 5,801,954 A | 9/1998 | Le et al. | 364/488 |
| 5,807,649 A | 9/1998 | Liebmann et al. | 430/5 |
| 5,853,923 A | * 12/1998 | Tzu | 430/5 |
| 5,888,678 A | 3/1999 | Tzu et al. | 430/5 |
| 5,923,566 A | 7/1999 | Galan et al. | 364/489 |
| 6,251,547 B1 | * 6/2001 | Tzu et al. | 430/5 |

* cited by examiner

*Primary Examiner*—S. Rosasco
(74) *Attorney, Agent, or Firm*—George O. Saile; Stephen B. Ackerman; William J. Stoffel

(57) ABSTRACT

A method for forming a binary intensity mask (BIM) using two writing steps. The first writing step has a narrow writing area, preferably about 1 micron, and outlines the desired pattern. The second writing area partially overlaps the first writing area, preferably by less than half of the E-beam diameter used for writing. The second writing does not overlap the desired pattern. The chromium layer of the BIM is dry etched after the first writing, providing good edge definition and dimensional stability. The chromium layer of the BIM is wet etched following the second writing reducing mask defects.

12 Claims, 5 Drawing Sheets

METHOD FOR FORMING BINARY INTENSITY MASKS

BACKGROUND OF INVENTION

1) Field of the Invention

This invention relates generally to fabrication of a semiconductor device and more particularly to a method for forming binary intensity masks (BIM) which provides reduced exposure time and improved uniformity of critical dimensions (CD).

2) Description of the Prior Art

Binary intensity masks (binary masks, chrome-on-glass, BIM) are widely used in semiconductor fabrication. Typically, a layer of opaque material, such as chrome, is deposited on a transparent substrate material, such as quartz. The opaque layer is then patterned using an E-beam process. Next, a semiconductor structure or wafer is coated with a layer of photosensitive material and light energy, is transmitted through the binary mask onto the semiconductor structure, exposing the photosensitive layer in areas underlying where the opaque material has been removed. The photosensitive layer is then exposed to a chemical developing solution which, depending on the type of photosensitive material, removes either the exposed areas of the photosensitive layer or the unexposed areas of the photosensitive layer. In this way layers of a semiconductor device, particularly polysilicon layers, can be patterned.

However, the typical BIM process suffers from several disadvantages. As device geometries continue to shrink and device densities increase, critical dimension uniformity must increase to prevent defects. Also, exposure time for patterning increases.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,888,678 (Tzu et al.) Teaches a mask and a method for forming an alternating phase shift mask (APSM)and a binary intensity mask (BIM) on the same mask.

U.S. Pat. No. 5,288,569 (Lin)teaches feature biasing and absorptive phase shift techniques.

U.S. Pat. No. 5,807,649 (Liebmann et al.) Discloses a phase trim mask with dimensions increased to remove defects.

U.S. Pat. No. 5,801,954 (le et al.)describes a method for designing a BIM.

U.S. Pat. No. 5,923,566 (Galan et al.) Teaches a phase shift design verification routine.

SUMMARY OF THE INVENTION

It is an object of the present invention to provide a method for forming a binary intensity mask with reduced exposure time and greater critical dimension uniformity.

It is another object of the present invention to provide a method for forming a binary intensity mask with reduced probability of mask defects.

It is yet another object of the present invention to provide a method for forming a binary intensity mask with reduced E-beam proximity effect.

To accomplish the above objectives, the present invention provides a method for forming a binary intensity mask using a two-step writing process. The first writing step has a narrow writing area, preferably about 1 micron, and outlines the desired pattern (which is not exposed). The second writing area partially overlaps the first writing area, preferably by less than half of the E-beam diameter used for writing, and extends opposite the desired pattern. The second writing does not overlap the desired pattern. The chromium layer of the BIM is dry etched after the first writing, providing good edge definition and dimensional stability. The chromium layer of the BIM is wet etched following the second writing reducing mask defects.

The present invention provides considerable improvement over the prior art. The present invention provides a method for forming a BIM with a reduced exposure time, reducing fabrication costs and cycle time. The present invention provides greater critical dimension uniformity, increasing yield. Also, because the majority of the chromium layer, which is removed, is wet etched, mask defects are reduced.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 6B is a cross section taken along axis 6B–6B' of FIG. 6A. FIG. 7B is a cross section taken along axis 7B–7B' of FIG. 7A.

DETAILED DESCRIPTION OF THE INVENTION

The present invention will be described in detail with reference to the accompanying drawings. The present invention provides a method for forming binary intensity masks and using the binary intensity masks to pattern a target layer of a semiconductor structure. The present invention provides reduced exposure time and improved critical dimension uniformity.

Forming Patterns

Figure 1:
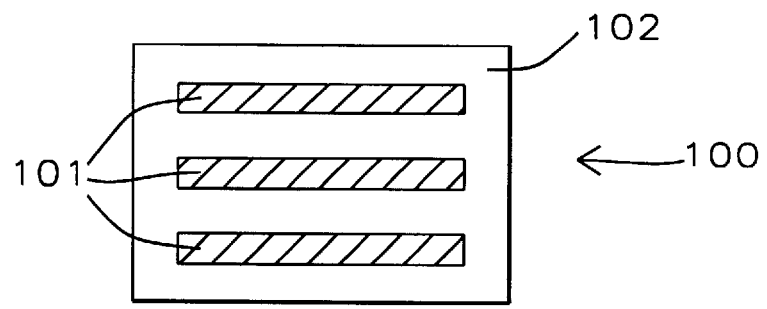
FIGS. 1 through 5 illustrate sequential views of a process for forming patterns for a binary intensity mask according to the invention.

Referring to FIG. 1, the process begins by providing the initial pattern (100) to be transferred to a target layer of a semiconductor structure. The initial pattern (100) comprises a dark area (101) corresponding to areas where a target layer of a semiconductor structure would not be exposed (e.g. where chrome film will be left on the mask)(e.g. the pattern), and a light area (102) corresponding to areas where a target layer of a semiconductor structure would be exposed (e.g. where a chrome film is removed from the mask). Typically, the light area (102) is the field surrounding the dark area (101) or pattern.

Figure 2:
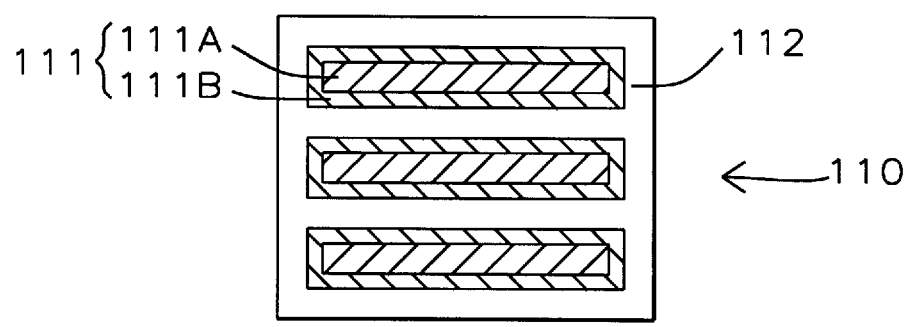

The second pattern (110),.as shown in FIG. 2, is formed by growing (enlarging) the dark area (101) of the initial pattern (100) by 1 micron per side. It should be noted that this pattern manipulation, as well as subsequent pattern manipulations for the third, fourth, and fifth patterns, can be performed using a computer aided design (CAD) system and known CAD techniques. The resulting second pattern (110) comprises a dark area (111) and a light area (112). The dark area (111) consists of the initial pattern (111A) and the pattern growth (111B).

Figure 3:
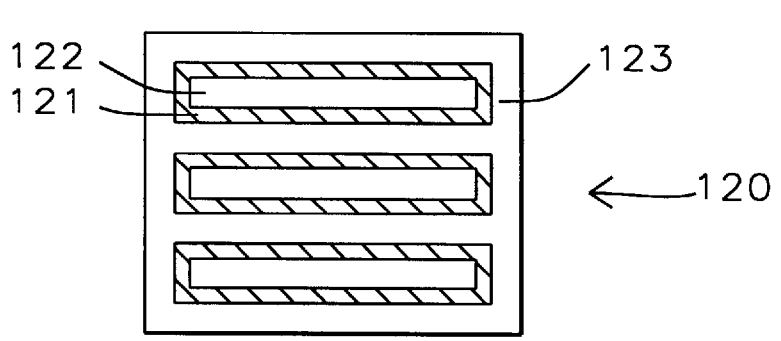

As shown in FIG. 3, a third pattern (120) is formed by subtracting the initial pattern (100) from the second pattern (110). The resulting pattern comprises a dark area (121), a first light area (122) and a second light area (123). The dark area (121) corresponds to the pattern growth (111B) of the second pattern. The first light area (122) corresponds to the dark area (101) of the initial pattern (100). The second light area (123) is the field surrounding the dark area (121).

Figure 4:
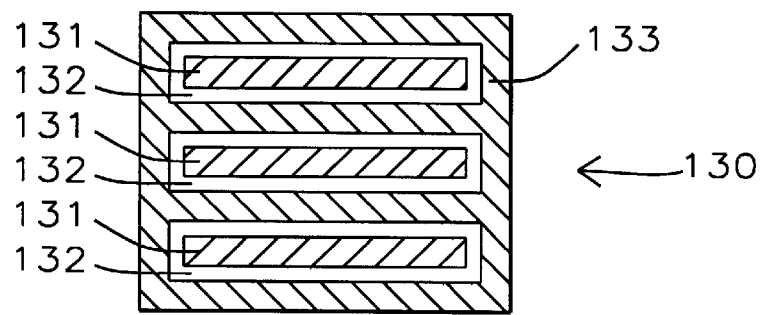

Referring to FIG. 4, a fourth pattern (130) is formed by reversing the light areas and dark areas of the third pattern (120). The resulting pattern has a first dark area (131), a light area (132), and a second dark area (133). The first dark area (131) is equivalent to the dark area (101) from the initial pattern (100). The light area (132) is equivalent to the pattern growth (111B) from the second pattern (110), and the second dark area (133) is the field surrounding the light area (132).

Figure 5:
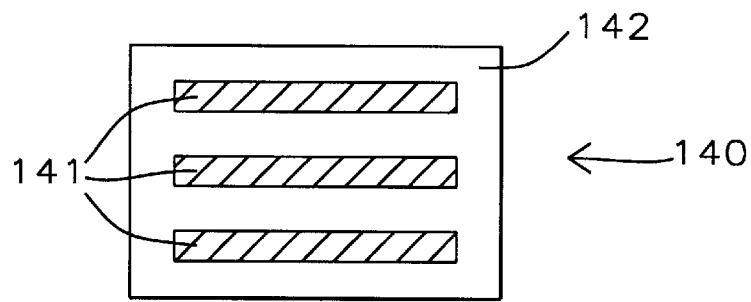

Referring to FIG. 5, a fifth pattern (140) is formed by growing the second pattern (110) by −0.5 μm (shrinking the second pattern by 0.5 microns). The resulting pattern has a dark area (141) which is 0.5 microns larger than the dark area (101) in the initial pattern (100). A light area (142) is the field surrounding the dark area (141).

Writing the Patterns onto a Mask Substrate

Figure 6A:
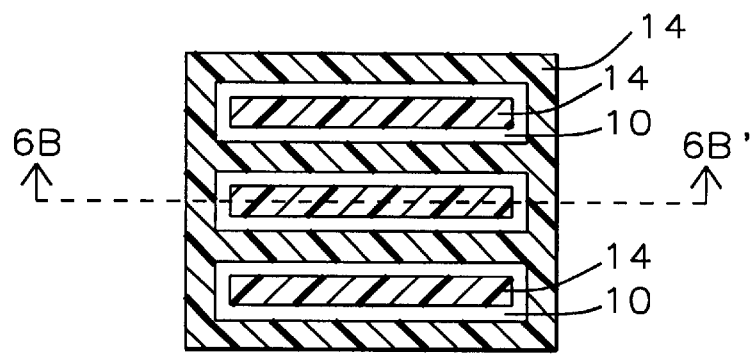
FIGS. 6A, 6B, 7A and 7B illustrates sequential views of a process for forming a binary intensity mask to pattern a target layer of semiconductor structure according to the present invention.
Figure 6B:
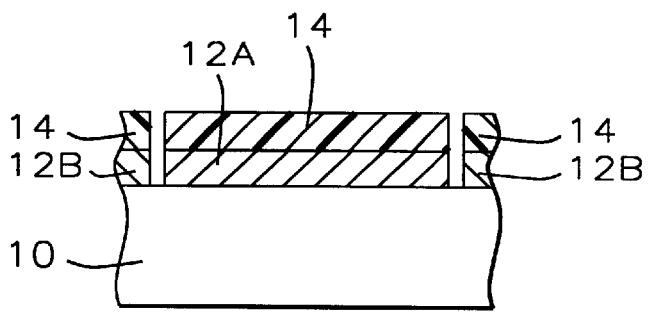

Referring to FIGS. 6A and 6B, a transparent mask substrate (10)is provided, preferably comprising quartz, with an opaque layer (12), preferably comprising chromium, thereon. The fourth pattern (130) is written onto the opaque layer (12). A layer of resist (14) is deposited over the substrate (10) and opaque layer (12). The resist (14) is then exposed to light energy through the fourth pattern (130). The exposed areas of the resist are removed using a developer, and the opaque layer is dry etched through the openings formed in the resist. After dry etching, the resist is removed and the substrate (10) and opaque layer (12) are cleaned. As shown in FIG. 6B, following the dry etch, the opaque layer is separated into two areas: a first opaque area (12A) corresponding to the first dark area (131) of the fourth pattern (130), and a second opaque area (12B) corresponding to the second dark area (133) of the fourth pattern (130).

Figure 7A:
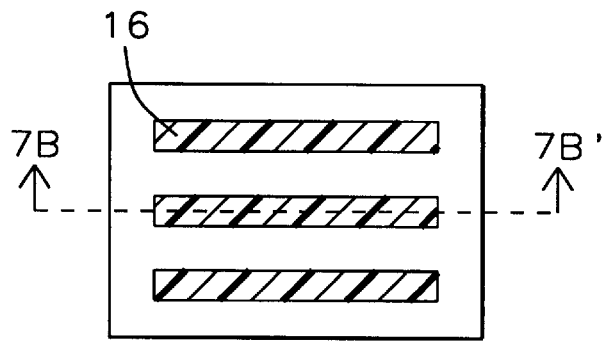
Figure 7B:
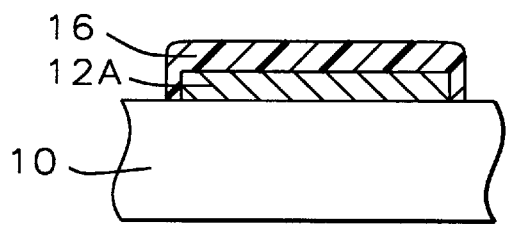

Referring to FIGS. 7A and 7B, a second resist layer (16)is deposited over the substrate (10) and the opaque layer (12), and the fifth pattern (140) is written onto the opaque layer (12). The resist is exposed to light energy through the fifth pattern (140); whereby areas of resist underlying light areas (142) of the fifth pattern (140) are exposed and areas of the resist underlying dark areas (141) of the fifth pattern (140) are masked. Areas of the resist which have been exposed are removed using a developer, and the opaque layer (12) is wet etched through the resulting openings in the second resist layer (16). After dry etching, the resist is removed and the substrate (10) and opaque layer (12) are cleaned.

A key advantage of the present invention is that the first opaque area (12A) is not affected by the wet etch, because the dark area (141) of the fifth pattern (140) is about 0.5 microns larger in each direction than the first dark area (131) of the fourth pattern (130). The outside edge of the first opaque area is protected by the second resist (16) during the wet etch. This provides the advantages of the wet etch, particularly reduced mask defects, without adversely affecting the outside edge of the first opaque area (12A).

Experimental Results

Figure 8:
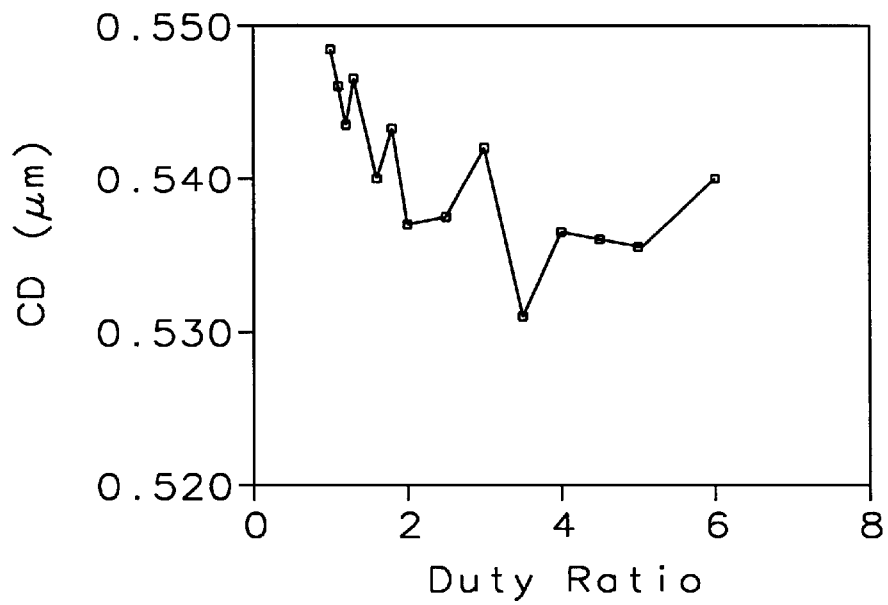
FIGS. 8 and 9 show the variations of critical dimensions for a conventional binary intensity mask process and for a binary intensity mask process according to the present invention respectively.
Figure 9:
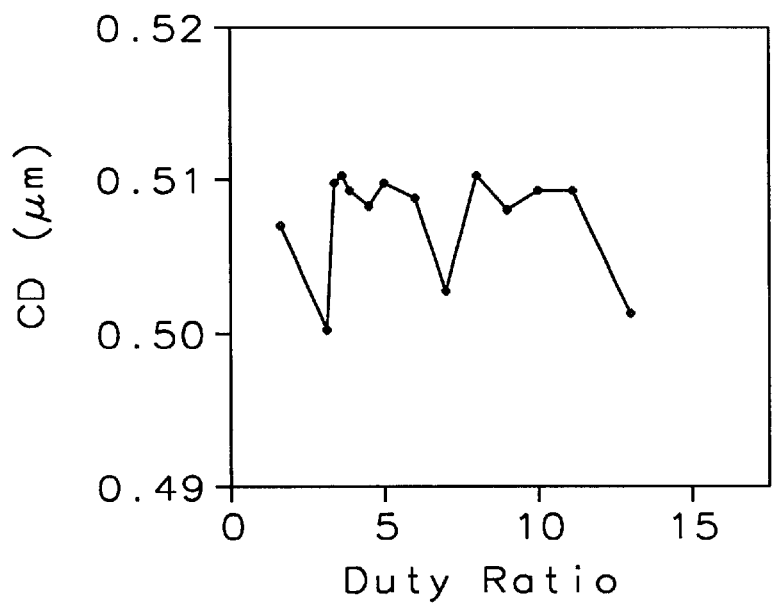

Binary intensity masks were formed using a conventional process and using the process according to the present invention. Critical dimensions were measured on the masks from each process. The masks formed using a conventional process, as shown in FIG. 8, have a 3 standard deviation critical dimension uniformity of 35 nm. The masks formed using the process according to the present invention have a 3 standard deviation critical dimension uniformity of 20 nm.

Preferred Embodiment

Figure 10:
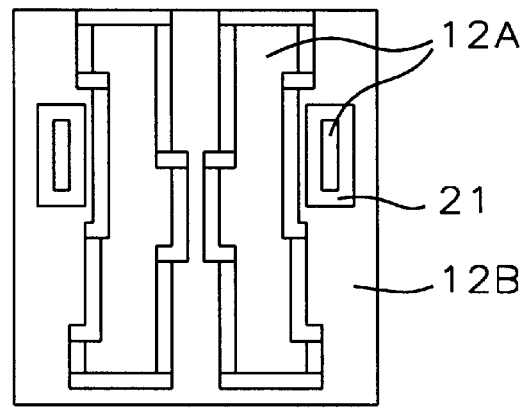
FIGS. 10 and 11 show the first writing and the second writing respectively for a binary intensity mask process according to the present invention.
Figure 11:
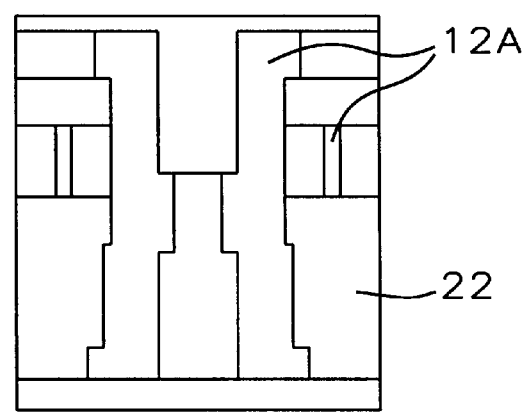

The first and second writings respectively for an example binary intensity mask as shown in FIGS. 10 and 11. The first writing forms a first opaque area (12A) a first writing area (21) and a second opaque area (12B). The first opaque area (12A) corresponds to the first dark area of a fourth pattern as described above. The first opaque area (12A) is the pattern which will remain on the binary intensity mask and is formed using a dry etch. The first writing area (21) surrounds the first opaque area and has a width of between about 0.2 microns and 1 micron, most preferably about 1 micron. The second opaque area (12B) surrounds the first writing area (21).

The second writing provides an oversize mask of the first opaque area (12A). The undeveloped resist (or first dark area of the second writing) which masks the first opaque area extends beyond the edge of the first opaque area by less than half of the E-beam diameter, between about 0.1 microns and 0.5 microns, most preferably about 0.5 microns. The undeveloped resist is formed by the first dark area of the fifth pattern (140). The second writing area (22) overlaps the first writing area less than half of the E-beam diameter and completely removes the second opaque area (12B) from the first writing.

While the invention has been particularly shown and described with reference to the preferred embodiments thereof, it will be understood by those skilled in the art that various changes in form and details may be made without departing from the spirit and scope of the invention.

What is claimed is:

1. A method for forming a binary intensity mask, comprising the steps of:
   a. providing a mask comprising a transparent substrate with an opaque layer thereover; said opaque layer having a first resist layer thereon;
   b. performing a first writing of said first resist layer with a pattern having a first dark area with the initial pattern to be transferred to the target layer of the semiconductor structure, a light area having a width of less than the diameter of the writing E-beam adjacent to said first dark area, and a second dark area adjacent to said light area opposite said first dark area; whereby an opening is formed in said first resist layer corresponding to said light area;

c. dry etching said opaque layer through said opening in said first resist layer to form a first writing area;

d. removing said first resist layer and forming a second resist layer on said opaque layer;

e. performing a second writing of said second resist layer with a pattern having a first dark area which has the shape of the initial pattern and is larger than the initial pattern and smaller than the combined size of the initial pattern and the first opening, and is surrounded by a light area; whereby an opening is formed in said second resist layer corresponding to said light area; and f. wet etching said opaque layer through said opening in said second resist layer.

2. The method of claim 1 wherein said first writing area has a width of between about 0.2 microns and 1.0 microns.

3. The method of claim 1 wherein said first writing area has a width of about 1 micron.

4. The method of claim 3 wherein said second writing area overlaps said first writing area by less than half of the diameter of the E-beam used for the second writing.

5. The method of claim 1 wherein said second writing area overlaps said first writing area by a width of between about 0.1 microns and 0.5 microns.

6. The method of claim 1 wherein said second writing area overlaps said first writing area by less than half of the diameter of the E-beam used for the second writing.

7. A method for forming a binary intensity mask, comprising the steps of:

a. providing an initial pattern which is to be transferred to a target layer of a semiconductor structure;

b. growing the initial pattern by about 1 micron per side to form a second pattern;

c. using the second pattern minus the initial pattern to form a third pattern;

d. reversing the third pattern to form a fourth pattern;

e. growing the second pattern by −0.5 microns to form a fifth pattern;

f. exposing a mask to E-beam light using said fourth pattern (130); said mask comprising a transparent substrate with an opaque layer thereon; said opaque layer having a first resist layer thereover; whereby a first writing area is formed in said first resist layer corresponding to said light area of said fourth pattern;

g. dry etching said opaque layer through said opening in said first resist layer;

h. removing said first resist layer and depositing a second resist layer over said opaque layer;

i. exposing said mask to E-beam light energy using said fifth pattern; whereby a second writing area is formed in said second resist layer corresponding to said light area of said fifth pattern; and j. wet etching said opaque layer through said opening in said second resist layer.

8. The method of claim 7 wherein said first writing area has a width of between about 0.2 microns and 1.0 microns.

9. The method of claim 7 wherein said first writing area has a width of about 1 micron.

10. The method of claim 9 wherein said second writing area overlaps said first writing area by less than half of the diameter of the E-beam used for the second writing.

11. The method of claim 7 wherein said second writing area overlaps said first writing area by a width of between about 0.1 microns and 0.5 microns.

12. The method of claim 7 wherein said second writing area overlaps said first writing area by less than half of the diameter of the E-beam used for the second writing.

* * * * *